(12) United States Patent
Mizukoshi

(10) Patent No.: US 6,773,947 B2
(45) Date of Patent: Aug. 10, 2004

(54) METHOD OF MANUFACTURING SEMICONDUCTOR DEVICE INCLUDING AN OPENING FORMED BY A LASER

(75) Inventor: Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/329,515

(22) Filed: Dec. 27, 2002

(65) Prior Publication Data
US 2003/0129814 A1 Jul. 10, 2003

(30) Foreign Application Priority Data
Jan. 8, 2002 (JP) ........................................ 2002-001738

(51) Int. Cl.⁷ .............................................. H01L 21/00
(52) U.S. Cl. .............................. 438/39; 438/40; 438/43; 438/637; 438/640; 438/963
(58) Field of Search ............................. 438/39, 40, 43, 438/6, 37, 638–640, 963

(56) References Cited

U.S. PATENT DOCUMENTS 6,231,567 B1 * 5/2001 Rizoiu et al. ................. 606/10

FOREIGN PATENT DOCUMENTS

JP 63293939 * 11/1988

* cited by examiner

Primary Examiner—Kamand Cuneo
Assistant Examiner—Asok Kumar Sarkar
(74) Attorney, Agent, or Firm—Armstrong, Kratz, Quintos, Hanson & Brooks, LLP.

(57) ABSTRACT

According to the present invention, of the resist film applied to the entire surface of the silicon substrate, the part on the electrode pattern is removed and an opening shaped like a dish in which the diameter of the upper part is larger than that of the lower part is formed, wherein the diameter of the lower part is smaller than the outer diameter of the electrode pattern. The electrode pattern exposed at the bottom of the opening is removed by the etching process. Next, the silicon substrate is tilted and a laser beam is irradiated toward the silicon substrate exposed at the bottom of the opening with water running over the surface of the resist film in air, and a hole is formed.

12 Claims, 8 Drawing Sheets

FIG.14

METHOD OF MANUFACTURING SEMICONDUCTOR DEVICE INCLUDING AN OPENING FORMED BY A LASER

This application claims the benefit of Japanese Patent Application No. 2002-001738 filed Jan. 8, 2002 in the Japanese Patent Office, the disclosure of which is hereby incorporated by reference.

BACKGROUND OF THE INVENTION

1. Field of the Invention

The present invention generally relates to methods of manufacturing semiconductor devices, and particularly to a method of manufacturing a semiconductor device formed with electrodes extending from the front surface to the back surface of a substrate.

2. Description of the Related Art

As an ultimate form of a semiconductor integrated circuit device, a three dimensional semiconductor integrated circuit device has been proposed.

Research has been conducted for stacking conventional two dimensional semiconductor integrated circuit devices and forming a three dimensional semiconductor integrated circuit device. In order to form the three dimensional semiconductor integrated circuit device by stacking the two dimensional semiconductor integrated circuit devices, it is necessary to connect the stacked two dimensional semiconductor integrated circuit devices at the shortest possible distance from each other. To this end, it has been found advantageous to provide a via hole that passes through the semiconductor, or a through-type via hole, in the semiconductor substrate, and connect the stacked two dimensional semiconductor integrated circuit devices to each other through such through-type via hole.

When forming the through-type via hole in the semiconductor substrate and conducting the stacking process three dimensionally, a method using reactive ion etching (RIE) that uses reactive gas, and a method of irradiating a laser beam are known as methods of forming the through-type via hole.

SUMMARY OF THE INVENTION

However, when the through-type via hole is formed using the RIE, a separate process is required to form an insulating film such as $SiO_2$ on the surface of the through-type via hole by the CVD method and the like, after the through-type via hole is formed.

On the other hand, when the through-type via hole is formed by irradiating a laser beam, it is possible to form an insulating film such as $SiO_2$ on the surface of the through-type via hole and to form the through-type via hole simultaneously by irradiating the laser beam in air. However, debris is generated with the formation of the through-type via hole, and a problem that such debris are attached around the through-type via hole arises. In particular, when the through-type via hole is formed by irradiating the laser beam to the silicon substrate, a problem regarding cracks caused by heat distortion of the silicon substrate arises in addition to the attachment of debris around the through-type via hole.

A method has been proposed to prevent the attachment of the debris. This method includes turning the silicon substrate upside down, irradiating such substrate with the laser beam, and the debris dropping off in a vacuum. However, another problem arises in that in a vacuum, not enough insulating film ($SiO_2$) is formed on the surface of the through-type via hole when the through-type via hole is formed. Furthermore, a method of irradiating a laser beam to the silicon substrate immersed in water may be used to prevent cracks caused by heat distortion. However, because the debris of the silicon is porous, they may rise to the surface of the water and scatter the laser beam, thus disturbing the formation of the through-type via hole.

Accordingly, it is a general object of the present invention to provide a method of manufacturing a semiconductor device allowing an accurate and an efficient formation of the through-type via hole, preventing cracks caused by the heat distortion of the semiconductor substrate, and forming sufficient insulating film on the surface of the through-type via hole.

The present invention achieves the above object by providing a method of manufacturing a semiconductor device including the step of forming an opening in a surface of the semiconductor substrate, and the method also includes the step of irradiating a laser beam to the surface of the semiconductor substrate while running water over the surface of the substrate.

In this way, by irradiating the laser beam to the semiconductor substrate while the water is running over the surface of the semiconductor substrate, the debris generated when the through-type via hole is formed in the semiconductor substrate is removed by the flow of water, thus preventing the laser beam from scattering and making it possible to form the via hole accurately and efficiently. Furthermore, since the formation of the through-type via hole and the formation of the insulating film on the surface of the relevant via hole are carried out simultaneously, the formation of a sufficient insulating film on the surface of the through-type via hole becomes possible without providing a separate step. Furthermore, by running water over the surface of the semiconductor substrate, cracks due to heat distortion of the semiconductor substrate may be prevented.

The present invention further achieves the above object by providing a method of manufacturing a semiconductor device including steps of forming a resist film on a surface of the semiconductor substrate, and forming a resist opening for exposing the surface of the semiconductor substrate in the resist film by patterning the resist film. The step of irradiating the laser beam is performed so as to irradiate the surface of the semiconductor substrate exposed at the resist opening with the laser beam, and the step of forming the resist opening is performed so that the resist opening has a greater diameter at its upper part than at its lower part.

DESCRIPTION OF THE PREFERRED EMBODIMENTS

The embodiments of the present invention will be explained hereinafter based on the figures.

[First Embodiment]

FIGS. 1 through 14 are sectional views showing the manufacturing steps of the semiconductor device according to an embodiment of the present invention.

Figure 1:
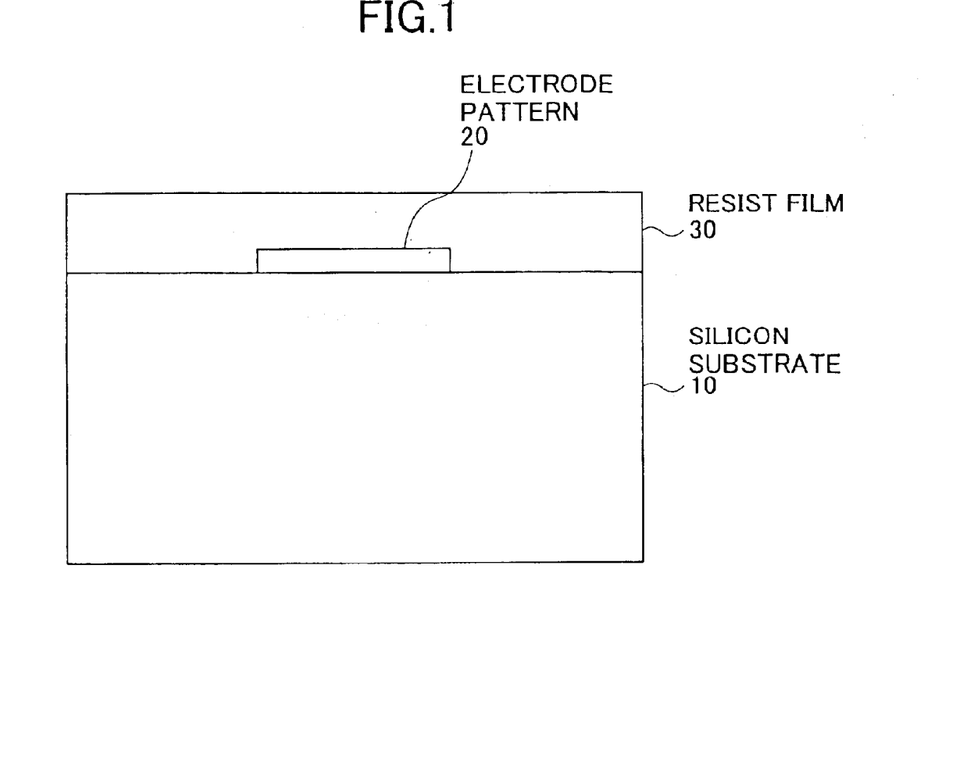
FIG. 1 is a sectional view showing a first step in the manufacturing method of the present invention.

Referring to FIGS. 1–14, in the first step shown in FIG. 1, an electrode pattern 20 is formed on a surface of a silicon substrate 10, and a resist film 30 is applied so as to cover the entire surface of the silicon substrate 10.

Figure 2:
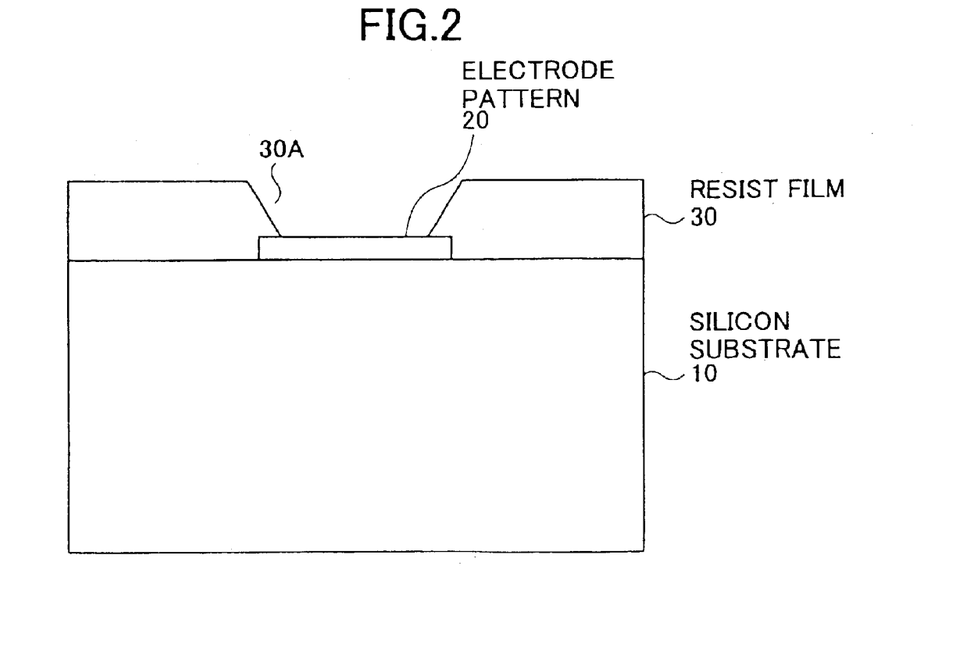
FIG. 2 is a sectional view showing a second step in the manufacturing method of the present invention.

In the second step shown in FIG. 2, of the resist film 30 applied to the entire surface of the silicon substrate 10, that part on the electrode pattern 20 is patterned and an opening 30A is formed. This opening 30A has a dish-like shape in which the diameter of its upper part is wider than that of its lower part. Here, the diameter of the lower part is smaller than that of the electrode pattern 20.

Many methods can be used to pattern the resist film 30 and form the dish-shaped opening 30A. For example, part of the resist film 30 on the electrode pattern 20 can be exposed to light and removed thus forming a cylindrical hole. The circumference of this cylindrical hole can then be subjected to a heat reflow process so that the upper part has a wider aperture than the lower part, thus forming the opening 30A. Alternatively, a plurality of resist layers having a different light absorbing property are deposited, and by mixing these resist layers at their boundaries, a distribution of light absorption may be formed in the resist layer 30.

Figure 3:
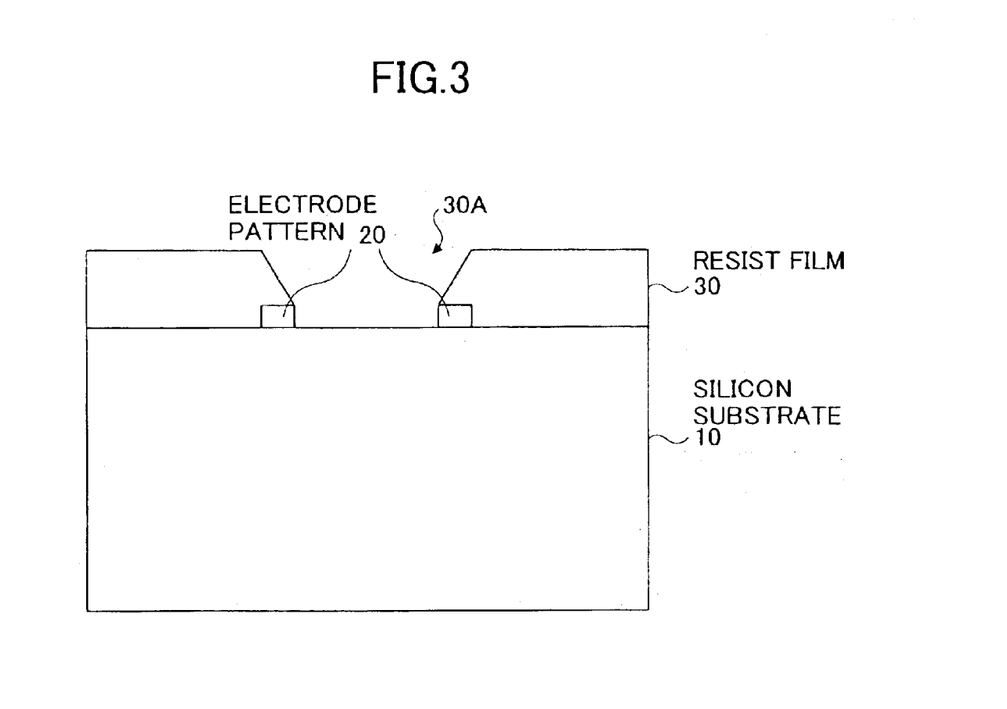
FIG. 3 is a sectional view showing a third step in the manufacturing method of the present invention.

In the third process shown in FIG. 3, the electrode pattern 20 exposed at the bottom of the opening 30A is removed by an etching process. Due to this process, the silicon substrate 10 becomes exposed at the bottom of the opening 30A.

Figure 4:
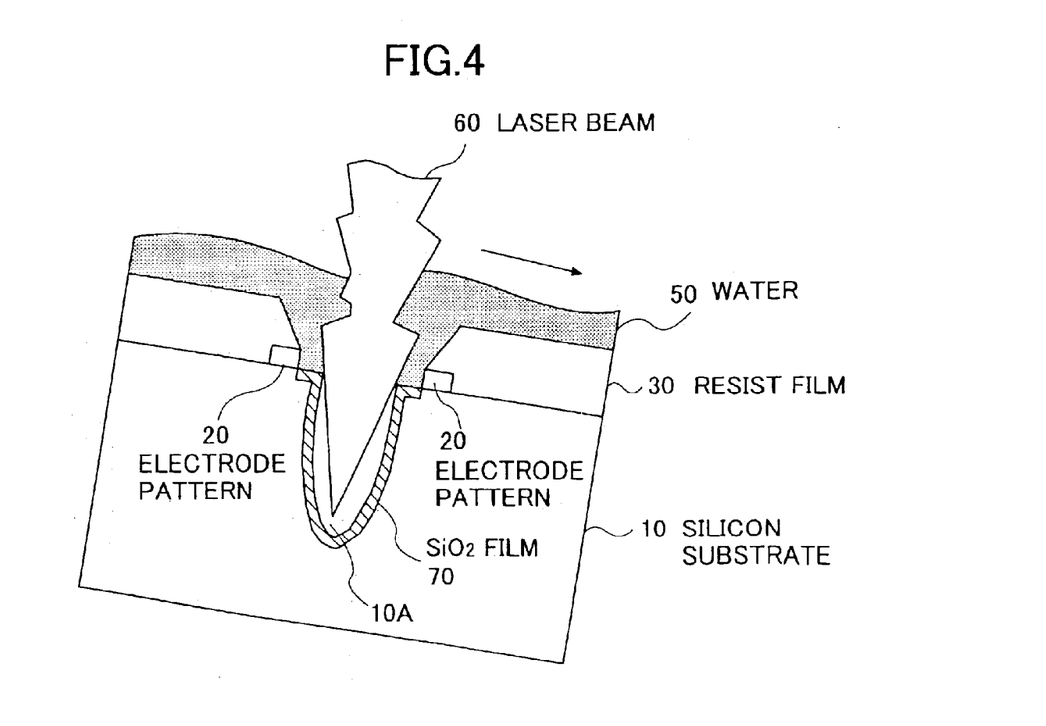
FIG. 4 is a sectional view showing a fourth step in the manufacturing method of the present invention.

In the fourth process shown in FIG. 4, the laser beam 60 is irradiated toward the silicon substrate 10 exposed at the bottom of the opening 30A while the silicon substrate 10 is tilted to one side, and water 50 is run over the surface of the resist film 30, in a direction shown by the arrow, in air. Through the irradiation of the laser beam 60, a fish hook shaped hole 10A having a diameter of 10 microns and a depth of 50 to 300 microns is formed in the silicon substrate 10. On the surface of the silicon substrate 10 exposed at the relevant hole 10A and the opening 30A, a $SiO_2$ film 70 is formed as an insulating film.

In this embodiment, by running the water 50 over the surface of the silicon substrate 10 while irradiating it with the laser beam 60, the debris generated with the irradiation of the laser beam 60 are removed with the flow of water and thus the laser beam 60 is not scattered. According to the first embodiment, it now becomes possible to form the hole 10A accurately and efficiently in the silicon substrate 10. Furthermore, by running the water 50, not only are the debris around the hole 10A removed, but also the silicon substrate 10 is cooled and cracks due to heat distortion are prevented.

Regarding the laser beam 60, it is possible to use a YAG laser beam, an excimer laser beam, a Raman laser and the like. Here, on the surface of the $SiO_2$ film 70 thus formed, a separate $SiO_2$ film or a nitride film may also be formed.

Figure 5:
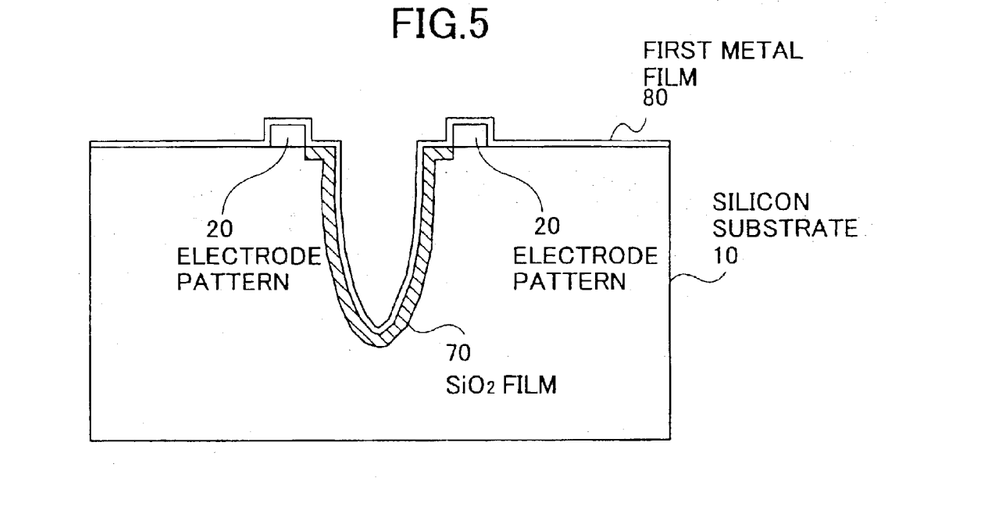
FIG. 5 is a sectional view showing a fifth step in the manufacturing method of the present invention.

In the fifth process shown in FIG. 5, the resist film 30 is removed and subsequently a first metal film 80 is formed on the surface of the silicon substrate 10 as a seed layer by the sputtering or the CVD method. This first metal film 80 is a combination of a metal that attaches to the $SiO_2$ film 70 acting as an insulating film and a metal capable of being soldered, such as Ti and Pd, Ti and Pt, Ti and Ni, and Cr and Cu. Alternatively, the first metal film 80 may be one type of metal or a metal alloy that attaches to the $SiO_2$ film 70 acting as an insulating film, and is capable of being soldered.

Figure 6:
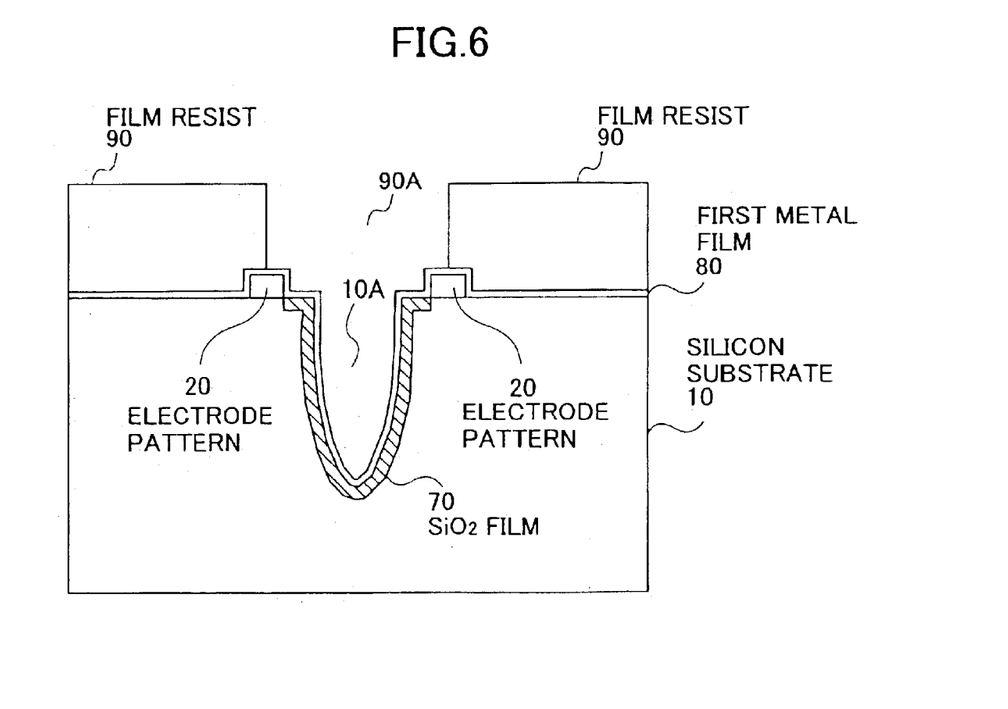
FIG. 6 is a sectional view showing a sixth step in the manufacturing method of the present invention.

In the sixth process shown in FIG. 6, a film-like resist (hereinafter referred to as the "film resist") 90 is attached to the surface of the first metal film 80 formed. The exposure development is further carried out and the film resist 90 is patterned to form a resist opening having a diameter smaller than the outer diameter of the electrode pattern 20 but larger than the diameter of the hole 10A.

Figure 7:
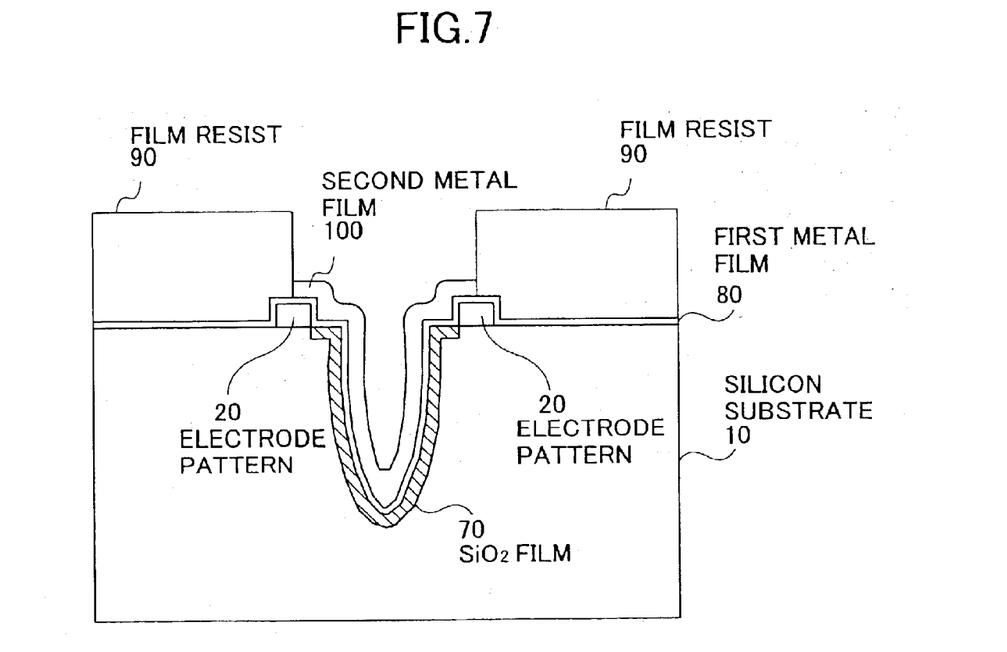
FIG. 7 is a sectional view showing a seventh step in the manufacturing method of the present invention.

In the seventh process shown in FIG. 7, a second metal film 100, formed by the plating process, is attached to the surface of the first metal film 80 exposed by patterning the film resist 90. An example of the materials used for the second metal film 100 are Cu, Ni, Pt, Pd, Au, Ag or a combination thereof.

Figure 8:
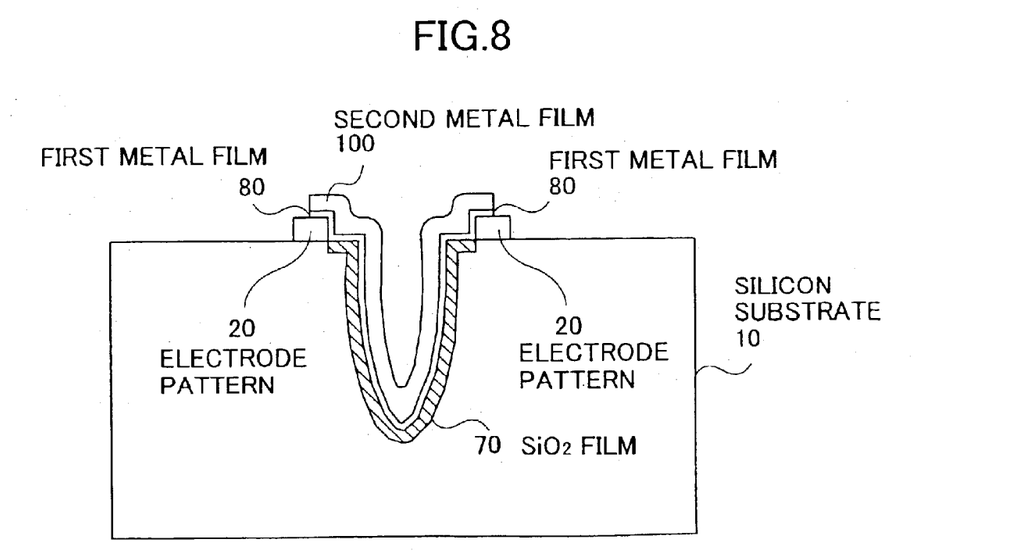
FIG. 8 is a sectional view showing an eighth step in the manufacturing method of the present invention.

In the eighth process shown in FIG. 8, the remainder of the film resist 90 is removed, and the first metal film 80 thus exposed is removed by the etching process. Since the first metal film 80 is thinner than the second metal film 100, even if such etching process is carried out, the second metal film 100 is not affected substantially.

Figure 9:
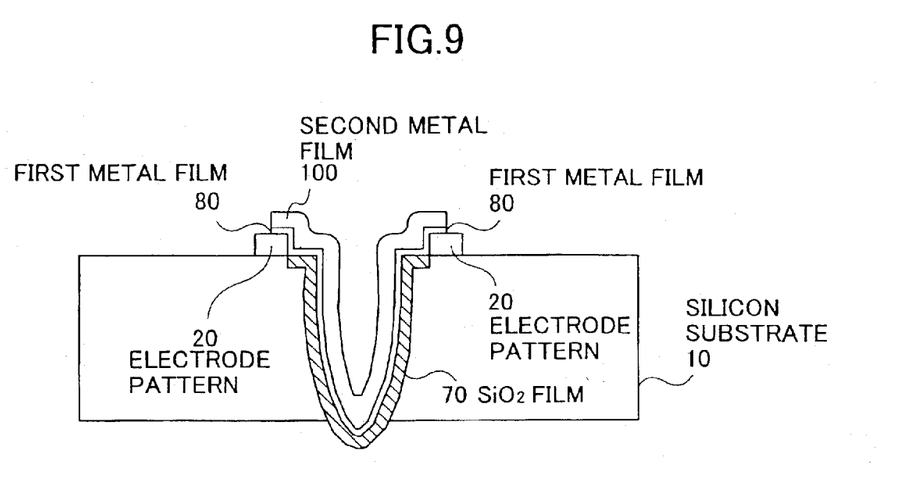
FIG. 9 is a sectional view showing a ninth step in the manufacturing method of the present invention.

In the ninth step shown in FIG. 9, the back surface of the silicon substrate 10 is ground until just before the first metal film 80 is exposed, and then the back surface of the silicon substrate 10 is subjected to dry etching with fluorine gas until about some tens of microns of the tip of the first metal film 80 are exposed.

Figure 10:
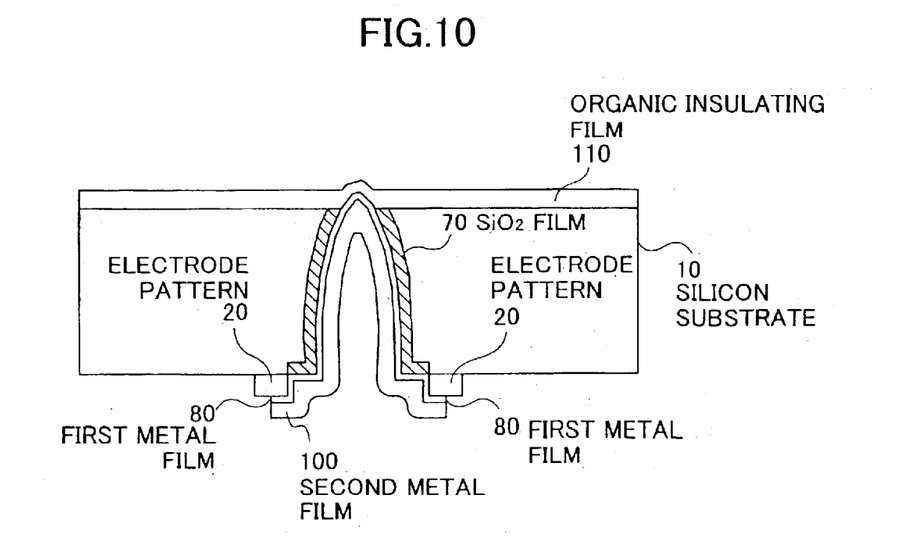
FIG. 10 is a sectional view showing a tenth step in the manufacturing method of the present invention.

Furthermore, in the tenth step shown in FIG. 10, the tip of the exposed first metal film 80 and the back surface of the silicon substrate 10 are coated with a film of organic insulating material (hereinafter referred to as "organic insulating film") 110 such as polyimide by the spin coating technique. Here, the viscosity of the organic insulating material and the rotating speed during the coating operation are adjusted, thus thickening the organic insulating film 110 coating the back surface of the silicon substrate and thinning the organic insulating film 110 coating the tip of the first metal film 80.

Here, if the first metal film 80 and the second metal film 100 are a combination of a metal that attaches to the $SiO_2$ film 70 acting as the insulating film and a metal capable of being soldered, such as Ti and Pd, Ti and Pt, Ti and Ni, Cr and Cu, the organic insulating film 110 is applied after the metal coating of for example, Ti and Cr that attaches to the $SiO_2$ film 70 is removed.

Figure 11:
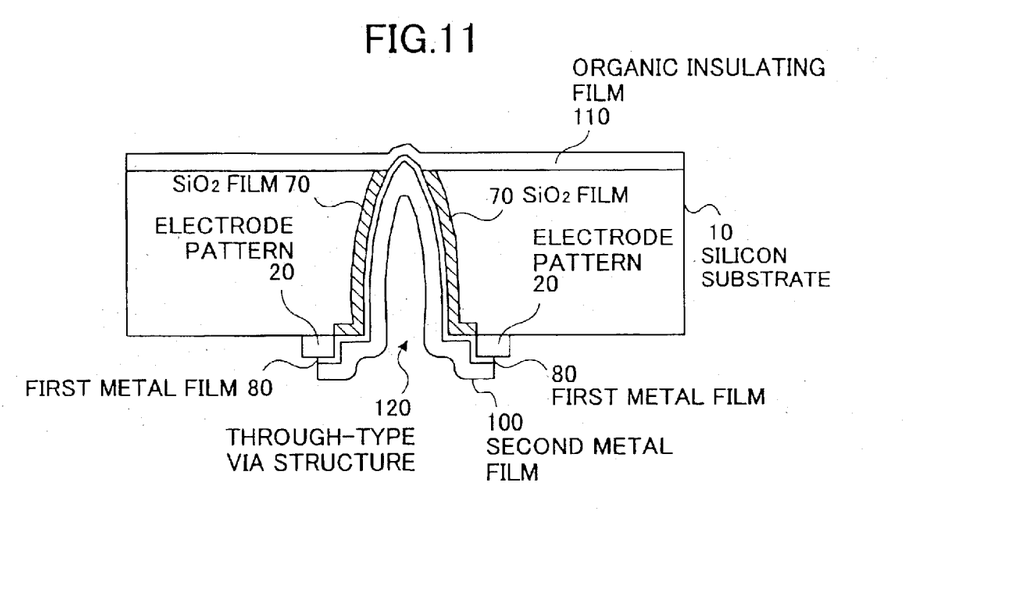
FIG. 11 is a sectional view showing an eleventh step in the manufacturing method of the present invention.

Next, in the eleventh step shown in FIG. 11, after the side with the organic insulating film 110 has been dried, the organic insulating film 110 coating the tip of the first metal film 80 is removed by the oxygen plasma process. Through these steps, a through-type via structure 120 that passes through the silicon substrate 10 and that has an electrically conductive plug in the inside is formed.

Figure 12:
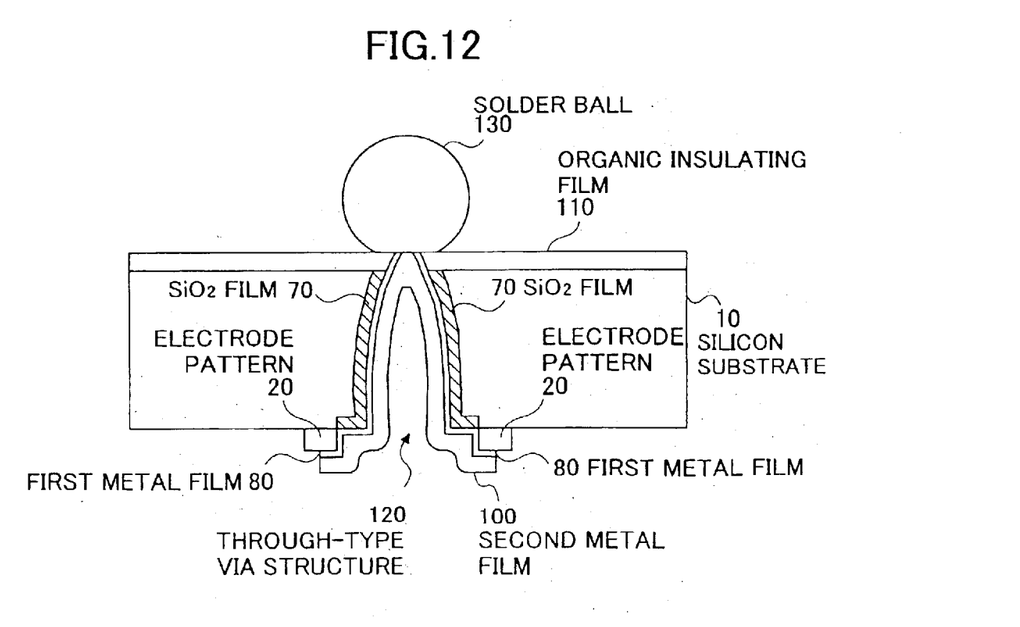
FIG. 12 is a sectional view showing a twelfth step in the manufacturing method of the present invention.

In the twelfth step shown in FIG. 12, at the tip of the first metal film 80 exposed by removing the organic insulating film 110, a solder ball 130 is provided and welded by applying heat.

[Second Embodiment]

Figure 13:
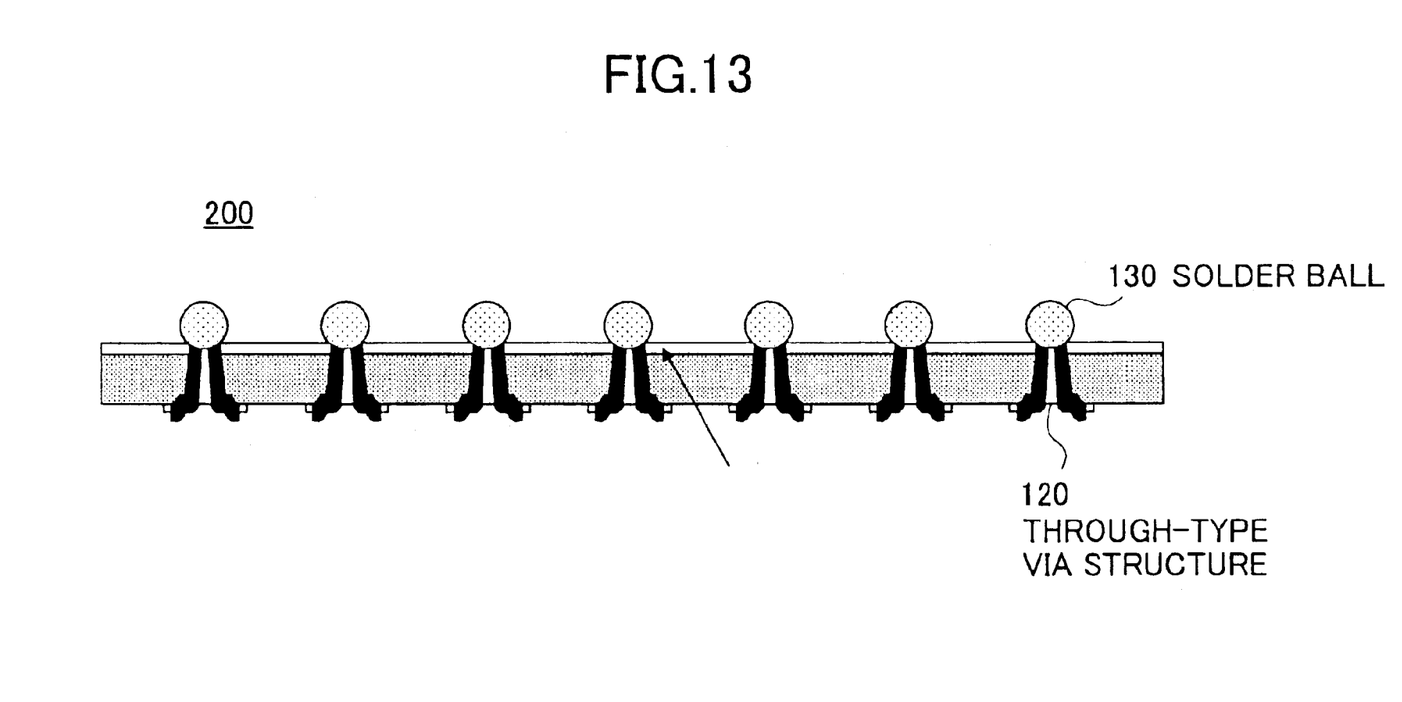
FIG. 13 is a diagram showing a structure of a two dimensional semiconductor integrated circuit device according to the present invention.
Figure 14:
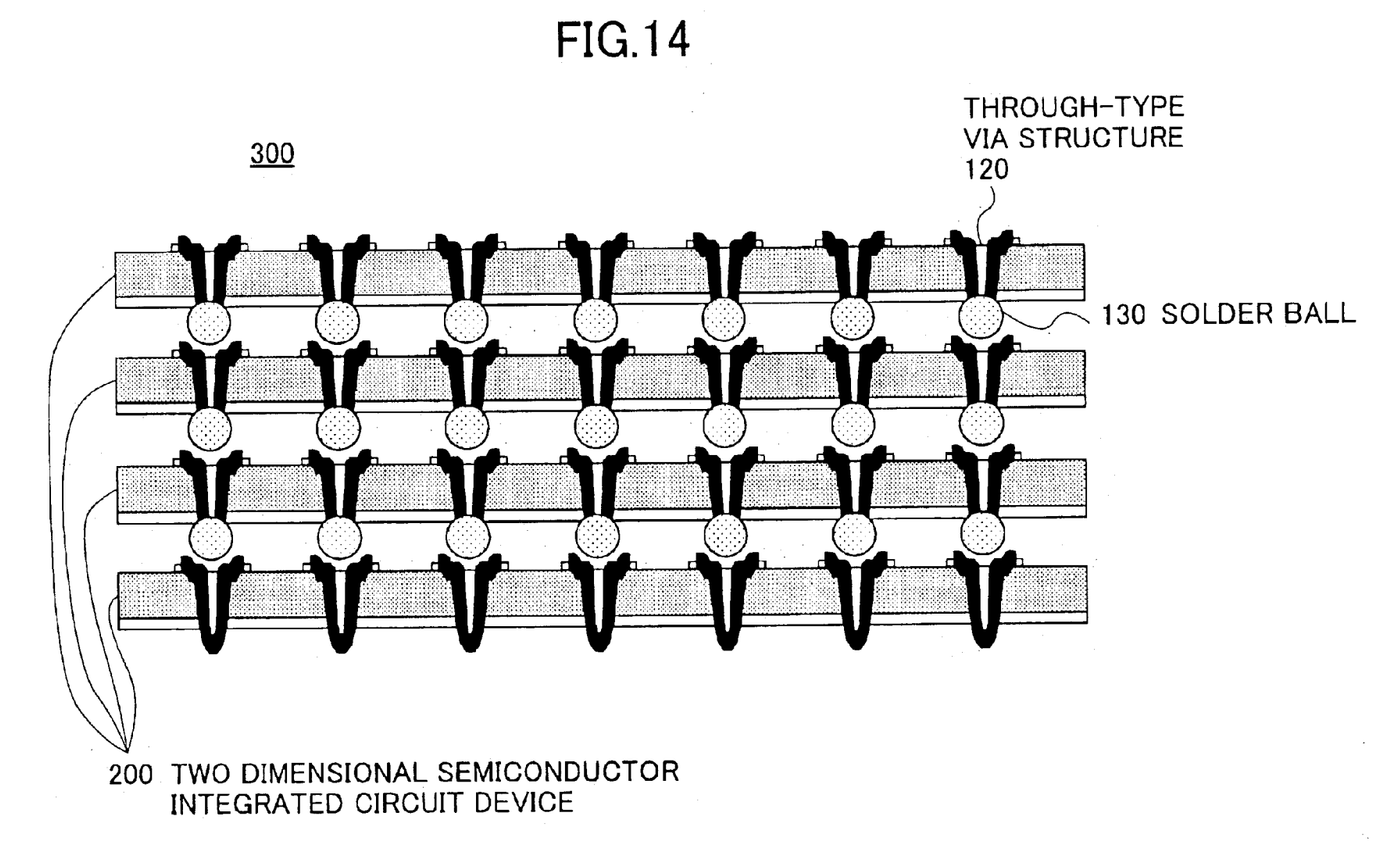
FIG. 14 is a diagram showing a structure of a three dimensional semiconductor integrated circuit device according to the present invention.

FIG. 13 shows a construction of a two dimensional semiconductor integrated circuit device 200 provided with multiple through-type via structures 120 by performing the first step through the twelfth step to the silicon substrate 10 at a predetermined interval, and FIG. 14 shows a construction of a three dimensional semiconductor integrated circuit device 300 formed by stacking such two dimensional semiconductor integrated circuit devices 200.

Referring to FIG. 13, the two dimensional semiconductor integrated circuit device 200 includes multiple passive elements not shown in the figure, and these passive elements are connected to the through-type via structure by a wiring pattern not shown in the figure.

As shown in FIG. 14, a plurality of two dimensional semiconductor integrated circuit devices 200 are stacked. A through-type via structure 120 of one of the two dimensional semiconductor integrated circuit devices 200 is connected to a through-type via structure 120 of another two dimensional semiconductor integrated circuit device 200 by welding the solder ball 130. The three dimensional semiconductor integrated circuit device 300 can thus be obtained.

In such a three dimensional semiconductor integrated circuit device 300 formed, because the two dimensional semiconductor integrated circuit device 200 of each layer is connected to adjacent devices 200 in the shortest way, parasitic inductance and capacitance is minimized and fast-speed operation becomes possible. Furthermore, an efficient heat radiation can be achieved via the through-type via structure 120 connected with one another.

Therefore, in the method of manufacturing a semiconductor device in the present embodiment, a part of the resist film 30 formed on the surface of the silicon substrate 10 is removed and an opening is formed. Furthermore, the silicon substrate 10 exposed at this opening is irradiated with a laser beam 60 while water 50 is run over the surface of the resist film 30 in air, and a via hole is formed. The debris are removed by flow of water, preventing the laser beam from scattering, and making it possible to form the via hole accurately and efficiently. Furthermore, cracks due to heat distortion of the silicon substrate 10 are prevented.

Furthermore, since the formation of the via hole and the formation of the insulating film on the surface of this via hole are performed simultaneously, forming a sufficient insulating film on the surface of the via hole becomes possible without a separate step. Furthermore, since the opening has a dish-shaped form in which the aperture of the upper part is wider than the aperture of the lower part, by running water over the surface of the resist film 30 while the silicon substrate 10 is being tilted, the water easily flows into the opening and the debris can be easily removed.

According to the present invention, by irradiating the semiconductor substrate with the laser beam, and with water running over the surface of the semiconductor substrate, the debris generated in the formation of the through-type via hole in the semiconductor substrate may be removed with the flow of water, the laser beam is prevented from scattering, and a through-type via hole is formed accurately and efficiently. Furthermore, a sufficient insulating film may be formed on the surface of the through-type via hole without providing a separate step since the formation of the through-type via hole and the formation of the insulating film on the surface of the relevant through-type via hole is carried out simultaneously. Furthermore, by running water over the surface of the semiconductor substrate, cracks due to heat distortion of the semiconductor substrate may be prevented.

While the preferred form of the present invention has been described, it is to be understood that the present invention is not limited to these embodiments, and variations and modifications may be made without departing from the scope of the present invention.

What is claimed is:

1. A method of manufacturing a semiconductor device including forming an opening in a surface of a semiconductor substrate; the method comprising the steps of:

running water over said surface of said semiconductor substrate;

irradiating a laser beam to said surface of said semiconductor substrate while running water over said surface of said semiconductor substrate, said irradiating forming a hole in said surface of said semiconductor substrate; and forming a metal film on said surface of said semiconductor substrate having said hole.

2. The method of manufacturing a semiconductor device as claimed in claim 1, wherein water is ran over said surface of said semiconductor substrate with said semiconductor substrate in a tilted position.

3. A method of manufacturing a semiconductor device including forming an opening in a surface of a semiconductor substrate; the method comprising the steps of:

running water over said surface of said semiconductor substrate;

irradiating a laser beam to said surface of said semiconductor substrate while running water over said surface of said semiconductor substrate forming a resist film on said surface of said semiconductor substrate;

patterning said resist film and forming a resist opening in said resist film for exposing said surface of said semiconductor substrate;

said step of irradiating the laser beam is performed so as to irradiate said surface of said semiconductor substrate exposed at said resist opening with said laser beam;

said step of forming said resist opening is performed so that said resist opening comprises a diameter wider at an upper part than at a lower part.

4. The method of manufacturing a semiconductor device as claimed in claim 3, wherein said step of forming said resist opening includes steps of patterning said resist film, and reflowing said resist film after said step of patterning.

5. A method of manufacturing a semiconductor device, the method comprising the steps of:

forming a first resist film on a surface of a semiconductor substrate provided with an electrode pattern;

forming a first resist opening having a diameter larger at an upper part than at a lower part in said first resist film on said electrode pattern, said diameter of lower part being smaller than an outer diameter of said electrode pattern;

tilting said semiconductor substrate, irradiating said semiconductor substrate exposed at said first resist opening with a laser beam while running water over said surface of said first resist film in air, and forming a hole;

forming a first metal film on said surface of said semiconductor substrate provided with said hole;

forming a second resist film on a surface of said first metal film;

forming a second resist opening having a diameter larger than the diameter of said hole and smaller than said outer diameter of said electrode pattern in said second resist film;

forming a second metal film on said surface of said first metal film exposed at said second resist opening;

removing said second resist film;

removing said exposed first metal film;

grinding a back surface of said semiconductor substrate until just before said first metal film is exposed;

etching and removing said back surface of said semiconductor substrate until said first metal film is exposed; and forming an insulating film on said back surface of said semiconductor substrate and removing said formed insulating film from said first metal film to expose said first metal film.

6. The method of manufacturing a semiconductor device as claimed in claim 5, wherein said step of forming said insulating film on the back surface of the semiconductor substrate and removing said formed insulating film from said first metal film to expose said first metal film includes the steps of:

forming said insulating film on said back surface of said semiconductor substrate; and removing said insulating film formed on said first metal film from a tip of said first metal film.

7. The method of manufacturing a semiconductor device as claimed in claim 5, wherein said first metal film is a combination of a metal that attaches to said insulating film formed on said surface of said hole and a metal capable of being soldered, or, a metal or a metal alloy that attaches to said insulating film formed on said surface of said hole and capable of being soldered.

8. The method of manufacturing a semiconductor device as claimed in claim 5, wherein the method further comprises a step of welding a solder ball at said first metal film exposed by said etching and removing of said back surface.

9. The method of manufacturing a semiconductor device as claimed in claim 5, wherein the method further comprises a step of forming a separate insulating film or a nitride film on said surface of said insulating film formed on said surface of said hole.

10. The method of manufacturing a semiconductor device as claimed in claim 5, wherein said second metal film consists of copper, nickel, platinum, palladium, gold, silver, or a combination thereof.

11. The method of manufacturing a semiconductor device as claimed in claim 5, wherein the method further comprises a step of connecting a solder ball to said first metal film exposed at said back surface of said semiconductor substrate.

12. The method of manufacturing a semiconductor device as claimed in claim 11, wherein the method further comprises a step of connecting, by said solder ball, semiconductor elements provided with the solder balls on said first metal film exposed at said back surface of said semiconductor substrate so that a first metal film of one of said semiconductor elements is attached to a first metal film of another semiconductor element.

* * * * *